US011562961B2

(12) United States Patent
Lin

(10) Patent No.: US 11,562,961 B2
(45) Date of Patent: Jan. 24, 2023

(54) METHOD OF MANUFACTURING SEMICONDUCTOR STRUCTURE AND SEMICONDUCTOR STRUCTURE

(71) Applicant: NANYA TECHNOLOGY CORPORATION, New Taipei (TW)

(72) Inventor: Hsi-Hsiang Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 150 days.

(21) Appl. No.: 17/202,363

(22) Filed: Mar. 16, 2021

(65) Prior Publication Data

US 2022/0302040 A1 Sep. 22, 2022

(51) Int. Cl.
*H01L 23/532* (2006.01)
*H01L 23/522* (2006.01)
*H01L 21/768* (2006.01)

(52) U.S. Cl.
CPC .... *H01L 23/53238* (2013.01); *H01L 21/7682* (2013.01); *H01L 21/76802* (2013.01); *H01L 21/76843* (2013.01); *H01L 21/76871* (2013.01); *H01L 21/76877* (2013.01); *H01L 23/5226* (2013.01); *H01L 23/5329* (2013.01)

(58) Field of Classification Search
CPC ......... H01L 23/53238; H01L 21/76802; H01L 21/7682; H01L 21/76843; H01L 21/76871; H01L 21/76877; H01L 23/5226; H01L 23/5329
See application file for complete search history.

(56) References Cited

U.S. PATENT DOCUMENTS

| 8,772,942 B2 * | 7/2014 | Edelstein .......... H01L 21/76843 257/E23.141 |
| 9,768,065 B1 * | 9/2017 | Wang ................ H01L 23/53233 |
| 10,651,084 B1 * | 5/2020 | Ishii .................. H01L 21/76886 |

FOREIGN PATENT DOCUMENTS

TW 201330209 A 7/2013

* cited by examiner

*Primary Examiner* — Karen Kusumakar
(74) *Attorney, Agent, or Firm* — CKC & Partners Co., LLC

(57) ABSTRACT

A method of manufacturing a semiconductor structure includes: forming a first opening in a first dielectric material; forming a first barrier layer in the first opening; forming a first seed material including copper and manganese on the first barrier layer, in which the manganese in the first seed material is in a range of from 0.10 at % to 0.40 at %; forming a first conductive material on the first seed material; and moving at least some of the manganese of the first seed material to a location proximate an interface between the first seed material and the first barrier layer. Another method of manufacturing a semiconductor structure and a semiconductor structure are also provided.

20 Claims, 4 Drawing Sheets

METHOD OF MANUFACTURING SEMICONDUCTOR STRUCTURE AND SEMICONDUCTOR STRUCTURE

BACKGROUND

Field of Invention

The present disclosure relates to a method of manufacturing a semiconductor structure and a semiconductor structure.

Description of Related Art

In manufacturing of a semiconductor device, a metallization process is adopted to construct interconnection and contacts among various components on a single substrate. Copper interconnect having vias or trenches has been widely employed in semiconductor manufacturing with advantages of low electrical resistance and high speed transmission.

However, copper is prone to electromigration, causing malfunction of the semiconductor device. Therefore, a barrier layer is required to be deposited into the vias or trenches to protect the copper from electromigration.

However, the semiconductor device including the barrier layer has an upper limit of the life time, and thus how to prevent electromigration more effectively and even increase the life time of the semiconductor device has become a technical issue in this field.

SUMMARY

The present disclosure provides a method of manufacturing a semiconductor structure which can significantly improves the life time of the semiconductor structure.

In accordance with an aspect of the present disclosure, a method of manufacturing a semiconductor structure includes: forming a first opening in a first dielectric material; forming a first barrier layer in the first opening; forming a first seed material including copper and manganese on the first barrier layer, in which the manganese in the first seed material is in a range of from 0.10 at % to 0.40 at %; forming a first conductive material on the first seed material; and moving at least some of the manganese of the first seed material to a location proximate an interface between the first seed material and the first barrier layer.

According to some embodiments of the present disclosure, moving the at least some of the manganese of the first seed material to the location proximate the interface between the first seed material and the first barrier layer is conducted by heating the first seed material to a temperature in a range of from 400° C. to 460° C. in a hydrogen atmosphere.

According to some embodiments of the present disclosure, after moving the at least some of the manganese of the first seed material to the location proximate the interface between the first seed material and the first barrier layer, the location proximate the interface between the first seed material and the first barrier layer has a greater amount of the manganese than the first conductive material.

According to some embodiments of the present disclosure, moving the at least some of the manganese of the first seed material to the location proximate the interface between the first seed material and the first barrier layer includes forming a first manganese-rich layer including manganese, manganese oxide or a combination thereof at the location.

According to some embodiments of the present disclosure, a ratio of a thickness of the first manganese-rich layer to a thickness of the first seed material is in a range of from 1:20 to 1:3.

According to some embodiments of the present disclosure, the method further includes forming a void at a location proximate a corner of the first barrier layer when the first seed material including the copper and the manganese is formed on the first barrier layer; and moving at least some other of the manganese of the first seed material to the void.

According to some embodiments of the present disclosure, moving the at least some other of the manganese of the first seed material to the void includes forming manganese oxide filling the void.

According to some embodiments of the present disclosure, the method further includes forming a second dielectric material before forming the first opening in the first dielectric material; forming a second opening in the second dielectric material; forming a second barrier layer in the second opening; forming a second seed material including copper and manganese on the second barrier layer; forming a second conductive material on the second seed material; moving at least some of the manganese of the second seed material to a location proximate an interface between the second seed material and the second barrier layer; and forming the first dielectric material on the second dielectric material and the second conductive material.

According to some embodiments of the present disclosure, the manganese in the second seed material is in a range of from 0.10 at % to 0.40 at %.

According to some embodiments of the present disclosure, after moving the at least some of the manganese of the second seed material to the location proximate the interface between the second seed material and the second barrier layer, the location proximate the interface between the second seed material and the second barrier layer has a greater amount of the manganese than the second conductive material.

According to some embodiments of the present disclosure, moving the at least some of the manganese of the second seed material to the location proximate the interface between the second seed material and the second barrier layer comprises forming a second manganese-rich layer including manganese, manganese oxide or a combination thereof at the location proximate the interface between the second seed material and the second barrier layer.

In accordance with another aspect of the present disclosure, a method of manufacturing a semiconductor structure includes: forming a first opening in a first dielectric material; forming a first barrier layer in the first opening; forming a first seed material including copper and manganese on the first barrier layer, in which the manganese in the first seed material is in a range of from 0.10 at % to 0.40 at %, and a void is formed at a location proximate a corner of the first barrier layer when the first seed material including the copper and the manganese is formed on the first barrier layer; forming a first conductive material on the first seed material; and moving at least some of the manganese of the first seed material to the void.

According to some embodiments of the present disclosure, moving the at least some of the manganese of the first seed material to the void includes forming manganese oxide filling the void.

In accordance with another aspect of the present disclosure, a semiconductor structure includes a first conductive material including copper; a first barrier layer surrounding the first conductive material; and a first manganese-rich layer in the first conductive material and proximate an interface between the first conductive material and the first barrier layer, in which the first manganese-rich layer comprising manganese, manganese oxide or a combination thereof.

According to some embodiments of the present disclosure, the first manganese-rich layer includes the manganese arranged along the interface between the first conductive material and the first barrier layer.

According to some embodiments of the present disclosure, the manganese is in contact with the first barrier layer.

According to some embodiments of the present disclosure, the first manganese-rich layer includes the manganese oxide at a location proximate a corner of the first barrier layer.

According to some embodiments of the present disclosure, the manganese oxide is in contact with the corner of the first barrier layer.

According to some embodiments of the present disclosure, a location in the first conductive material and proximate the interface between the first conductive material and the first barrier layer has a greater amount of manganese than an upper surface of the first conductive material.

According to some embodiments of the present disclosure, a thickness of the first manganese-rich layer is in a range of from 20 angstroms to 400 angstroms.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "over," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" to "over." In addition, the spatially relative descriptions used herein should be interpreted the same.

As mentioned in the related art, how to prevent electromigration more effectively and even increase the life time of the semiconductor device has become a technical issue in this field. Therefore, the present disclosure provides a method of manufacturing a semiconductor structure including forming a seed material including copper and manganese on the barrier layer (in which the manganese in the seed material is in a range of from 0.10 at % to 0.40 at %) and moving at least some of the manganese of the seed material to a location proximate an interface between the seed material and the barrier layer, which significantly improves the life time of the semiconductor structure, for example, making the life time of the semiconductor structure under a deteriorating condition (i.e., at 200° C. with a current of 126 mA/$\mu m^2$) increase at least five times.

It is found that the manganese in the seed material can form a manganese-rich layer and repair defects (e.g., formed due to poor step coverage) after annealing, and thus can significantly improve the life time of the semiconductor structure. Embodiments of the method of manufacturing the semiconductor structure will be described in detail below.

Figure 1:
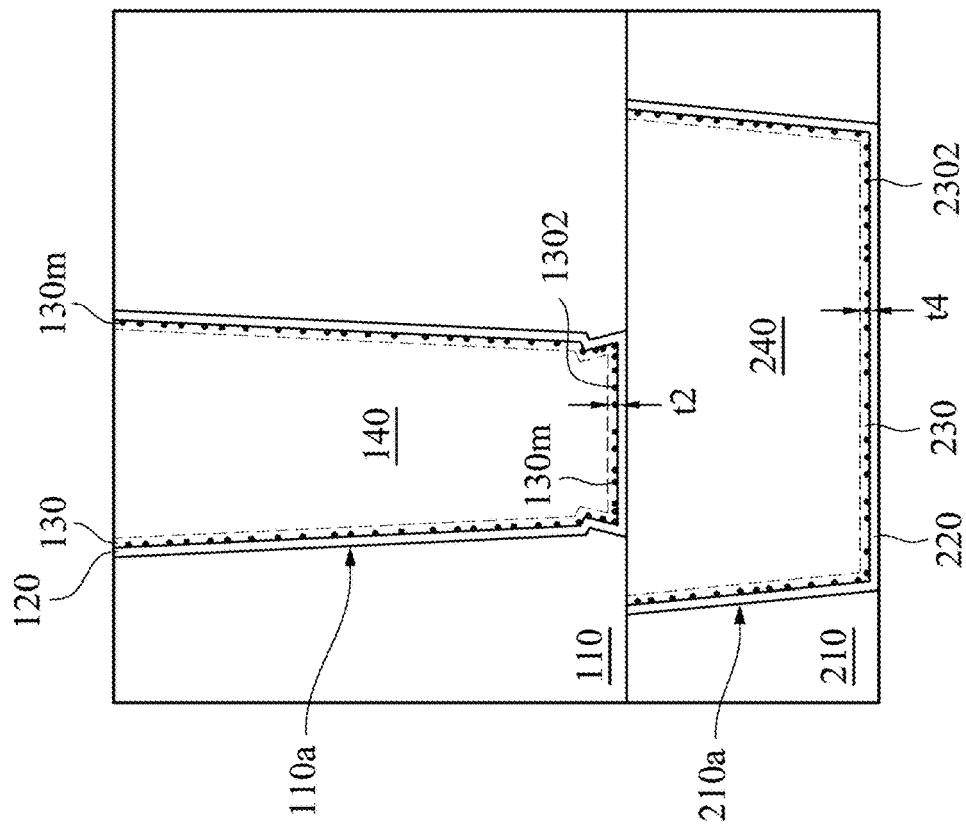
FIGS. 1 and 2 are cross-sectional views of a method of manufacturing a semiconductor structure at various stages in accordance with some embodiments of the present disclosure.
Figure 2:
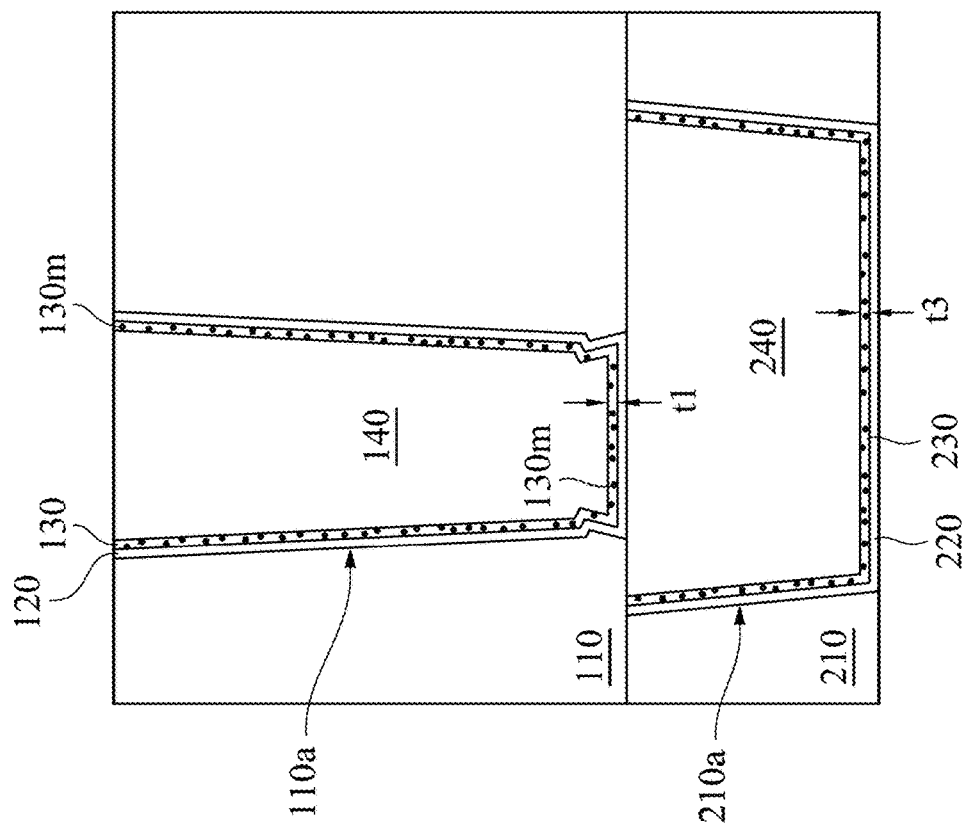

FIGS. 1 and 2 are cross-sectional views of a method of manufacturing a semiconductor structure at various stages in accordance with some embodiments of the present disclosure. As shown in FIG. 1, a first dielectric material 110 is formed. In some embodiments, the first dielectric material 110 includes silicon, a nitride material (e.g., silicon nitride), an oxide material (e.g., silicon oxide), an oxynitride material (e.g., silicon oxynitride), silicon carbide (SiC), silicon carbon nitride (SiCN), or a combination thereof. In some embodiments, formation of the first dielectric material 110 may include any suitable deposition method, such as coating, atomic layer deposition (ALD), plasma-enhanced atomic layer deposition (PEALD), chemical vapor deposition (CVD), plasma-enhanced chemical vapor deposition (PECVD), low pressure chemical vapor deposition (LPCVD), physical vapor deposition (PVD) (e.g., sputtering), and the like.

Next, as shown in FIG. 1, a first opening 110a (e.g., a trench) is formed in the first dielectric material 110. In some embodiments, the first opening 110a is formed by performing photolithographic and etching processes on the first dielectric material 110. In some embodiments, a depth of the first opening 110a is greater than a width of the first opening 110a. In some embodiments, the first opening 110a has an aspect ratio of the depth to the width less than or equal to 5, for example, in a range of from 1 to 3. In some embodiments, the first opening 110a is rectangular-shaped or trapezoid-shaped, but not limited thereto. In some embodiments, as shown in FIG. 1, a bottom of the first opening 110a is bell-shaped (i.e., having a narrow top and a wide bottom).

Subsequently, as shown in FIG. 1, a first barrier layer 120 is formed in the first opening 110a. In some embodiments, the first barrier layer 120 is conformally formed in the first opening 110a. In some embodiments, the first barrier layer 120 includes tantalum, titanium, cobalt, tungsten, ruthenium, tantalum nitride, titanium nitride, tungsten nitride, indium oxide or a combination thereof. In some embodiments, the first barrier layer 120 includes tantalum. In some embodiments, the first barrier layer 120 has a thickness in a range of from 80 angstroms to 500 angstroms, such as from 100 angstroms to 400 angstroms.

Next, as shown in FIG. 1, a first seed material 130 including copper and manganese 130m is formed on the first barrier layer 120. The manganese 130m in the first seed material 130 is in a range of from 0.10 at % to 0.40 at %, such as 0.15 at %, 0.20 at %, 0.25 at %, 0.30 at % or 0.35 at %. In some embodiments, the first seed material 130 is consisting essentially of copper and manganese 130m. In some embodiments, the first seed material 130 is formed by PVD, such as formed by sputtering using a target including copper and manganese. In some embodiments, the manganese in the target is in a range of from 0.10 at % to 0.40 at %, and the copper in the target is in a range of from 99.60 at % to 99.90 at %. In some embodiments, the first seed material 130 is formed by ALD, PEALD, CVD, PECVD or LPCVD.

In some embodiments, as shown in FIG. 1, the first seed material 130 is continuously and conformally formed on the first barrier layer 120, and there is no void formed at a location proximate a bottom corner of the first barrier layer 120. In some embodiments, the first seed material 130 has a thickness t1 in a range of from 100 angstroms to 1,000 angstroms, such as from 150 angstroms to 900 angstroms, from 200 angstroms to 800 angstroms, from 300 angstroms to 700 angstroms, or from 400 angstroms to 600 angstroms. In some embodiments, the thickness t1 of the first seed material 130 is greater than or equal to the thickness of the first barrier layer 120, but not limited thereto.

Subsequently, as shown in FIG. 1, a first conductive material 140 is formed on the first seed material 130 to fill the first opening 110a. In some embodiments, the first conductive material 140 includes copper. In some embodiments, the first conductive material 140 consisting essentially of copper. In some embodiments, the first conductive material 140 is formed by electrodeposition, such as electroplating. In some embodiments, the first conductive material 140 is formed by ALD, PEALD, CVD, PECVD, LPCVD or PVD.

In some embodiments, after the first conductive material 140 is formed, a planarization process (e.g., chemical-mechanical planarization) is performed to remove a portion of the first barrier layer 120, a portion of the first seed material 130 and a portion of the first conductive material 140 (not shown in FIG. 1) on the first dielectric material 110 to expose an upper surface of the first dielectric material 110.

Next, as shown in FIGS. 1 and 2, at least some of the manganese 130m of the first seed material 130 is moved to a location proximate an interface between the first seed material 130 and the first barrier layer 120. In some embodiments, moving the at least some of the manganese 130m of the first seed material 130 to the location proximate the interface between the first seed material 130 and the first barrier layer 120 is conducted by heating the first seed material 130 to a temperature in a range of from 400° C. to 460° C. in a hydrogen atmosphere, such as 410° C., 420° C., 430° C., 440° C., or 450° C. In some embodiments, the semiconductor structure including the first dielectric material 110, the first barrier layer 120, the first seed material 130 and the first conductive material 140 is heated to a temperature in a range of from 400° C. to 460° C. in a hydrogen atmosphere for a period in a range of from 30 minutes to 2.5 hours, such as 1 hour, 1.5 hour or 2 hours.

In some embodiments, as shown in FIG. 2, the first conductive material 140 includes copper, and the copper of the first seed material 130 is mixed with the copper of the first conductive material 140. In some embodiments, the copper of the first seed material 130 may not be distinguishable from the copper of the first conductive material 140.

In some embodiments, as shown in FIGS. 1 and 2, moving the at least some of the manganese 130m of the first seed material 130 to the location proximate the interface between the first seed material 130 and the first barrier layer 120 includes forming a first manganese-rich layer 1302 including manganese, manganese oxide or a combination thereof at the location.

In some embodiments, as shown in FIG. 2, the first manganese-rich layer 1302 is continuous or discontinuous, and is substantially conformally formed at the location proximate the interface between the first seed material 130 and the first barrier layer 120. In some embodiments, the first manganese-rich layer 1302 is substantially conformally formed on the first barrier layer 120. In some embodiments, at least some of the manganese 130m of the first manganese-rich layer 1302 is in contact with the first barrier layer 120.

In some embodiments, the first manganese-rich layer 1302 has a thickness t2 in a range of from 20 angstroms to 400 angstroms, such as from 30 angstroms to 350 angstroms, from 40 angstroms to 300 angstroms, from 50 angstroms to 250 angstroms, from 60 angstroms to 200 angstroms, or from 70 angstroms to 150 angstroms. In some embodiments, a ratio of the thickness t2 of the first manganese-rich layer 1302 to the thickness t1 of the first seed material 130 is in a range of from 1:20 to 1:3, such as from 1:18 to 1:4.

In some embodiments, as shown in FIG. 2, after moving the at least some of the manganese 130m of the first seed material 130 to the location proximate the interface between the first seed material 130 and the first barrier layer 120, the location proximate the interface between the first seed material 130 and the first barrier layer 120 has a greater amount of the manganese 130m than the first conductive material 140 (e.g., an upper surface of the first conductive material 140).

Figure 4:
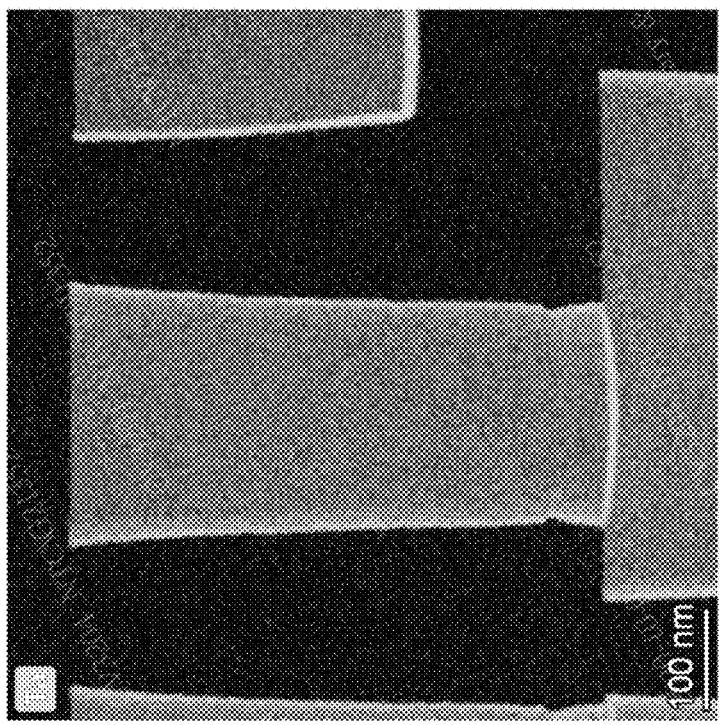
FIG. 4 is a TEM image of tantalum signal distribution of a first barrier layer of a semiconductor structure after annealing in accordance with Experimental Example 1 of the present disclosure.
Figure 3:
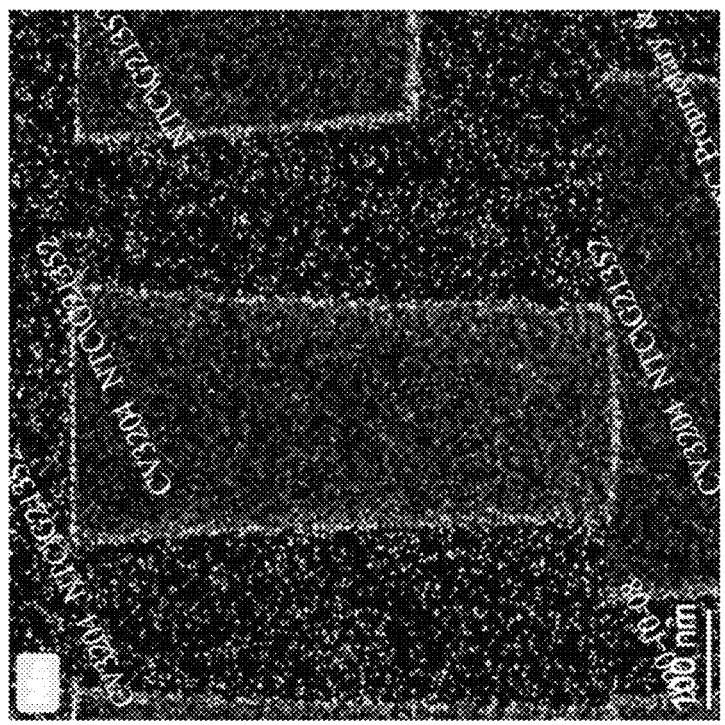
FIG. 3 is a TEM image of manganese signal distribution of a semiconductor structure after annealing in accordance with Experimental Example 1 of the present disclosure.

FIG. 3 is a TEM image of manganese signal distribution of a semiconductor structure after annealing in accordance with Experimental Example 1 of the present disclosure. FIG. 4 is a TEM image of tantalum signal distribution of a first barrier layer of a semiconductor structure after annealing in accordance with Experimental Example 1 of the present disclosure. The semiconductor structure of Experimental Example 1 was same as that of FIG. 1. The first seed material of the semiconductor structure of Experimental Example 1 had a thickness of from about 800 angstroms to about 1,000 angstroms. An annealing process was performed on the semiconductor structure of Experimental Example 1 with a temperature of about 420° C. in a hydrogen atmosphere for 1 hour.

FIG. 4 shows a contour of the first barrier layer (including tantalum) of the semiconductor structure of Experimental Example 1 after annealing. FIG. 3 shows manganese signal distribution of the semiconductor structure of Experimental Example 1 after annealing. As shown in FIG. 3, the manganese had a thickness in a range of from about 50 angstroms to about 150 angstroms, which proved that after annealing, the manganese of the first seed material did indeed move to the location proximate the interface between the first seed material and the first barrier layer and thus to form the first manganese-rich layer.

In some embodiments, as shown in FIG. 1, the method further includes forming a second dielectric material 210 before forming the first dielectric material 110 and forming the first opening 110a in the first dielectric material 110. In some embodiments, the second dielectric material 210 includes silicon, a nitride material, an oxide material, an oxynitride material, SiC, SiCN, or a combination thereof. In some embodiments, formation of the second dielectric material 210 may include any suitable deposition method, such as coating, ALD, PEALD, CVD, PECVD, LPCVD, PVD (e.g., sputtering), and the like.

In some embodiments, after the second dielectric material 210 is formed, a second opening 210a is formed in the second dielectric material 210. In some embodiments, the second opening 210a is formed by performing photolithographic and etching processes on the second dielectric material 210.

In some embodiments, after the second opening 210a is formed, a second barrier layer 220 is conformally formed in the second opening 210a. In some embodiments, the second barrier layer 220 includes tantalum, titanium, cobalt, tungsten, ruthenium, tantalum nitride, titanium nitride, tungsten nitride, indium oxide or a combination thereof. In some embodiments, the second barrier layer 220 includes tantalum. In some embodiments, the second barrier layer 220 has a thickness in a range of from 80 angstroms to 500 angstroms.

In some embodiments, after the second barrier layer 220 is formed, a second seed material 230 including copper and manganese is formed on the second barrier layer 220. The manganese in the second seed material 230 is in a range of from 0.10 at % to 0.40 at %, such as 0.15 at %, 0.20 at %, 0.25 at %, 0.30 at % or 0.35 at %. In some embodiments, the second seed material 230 is consisting essentially of copper and manganese. In some embodiments, the second seed material 230 is formed by PVD, such as by sputtering using a target including copper and manganese. In some embodiments, the manganese in the target is in a range of from 0.10 at % to 0.40 at %, and the copper in the target is in a range of from 99.60 at % to 99.90 at %. In some embodiments, the second seed material 230 is formed by ALD, PEALD, CVD, PECVD or LPCVD.

In some embodiments, as shown in FIG. 1, the second seed material 230 is continuously and conformally formed on the second barrier layer 220. In some embodiments, the second seed material 230 has a thickness t3 in a range of from 100 angstroms to 1,000 angstroms. In some embodiments, the thickness t3 of the second seed material 230 is greater than or equal to the thickness of the second barrier layer 220, but not limited thereto.

In some embodiments, after the second seed material 230 is formed, a second conductive material 240 is formed on the second seed material 230 to fill the second opening 210a. In some embodiments, the second conductive material 240 includes copper. In some embodiments, the second conductive material 240 consisting essentially of copper. In some embodiments, the second conductive material 240 is formed by electrodeposition, such as electroplating. In some embodiments, the second conductive material 240 is formed by ALD, PEALD, CVD, PECVD, LPCVD or PVD.

In some embodiments, after the second conductive material 240 is formed, a planarization process (e.g., chemical-mechanical planarization) is performed to remove a portion of the second barrier layer 220, a portion of the second seed material 230 and a portion of the second conductive material 240 (not shown in FIG. 1) on the second dielectric material 210 to expose an upper surface of the second dielectric material 210.

In some embodiments, after the second conductive material 240 is formed and the planarization process is performed, the first dielectric material 110 is formed on the second dielectric material 210 and the second conductive material 240. Embodiments of the first dielectric material 110 are described above, and thus are not repeated here.

In some embodiments, as shown in FIGS. 1 and 2, after the second conductive material 240 is formed and the planarization process is performed, at least some of the manganese of the second seed material 230 is moved to a location proximate an interface between the second seed material 230 and the second barrier layer 220 by heating the second seed material 230 to a temperature in a range of from 400° C. to 460° C. in a hydrogen atmosphere (i.e., an annealing process). In some embodiments, moving the at least some of the manganese 130m of the first seed material 130 and moving the at least some of the manganese of the second seed material 230 are simultaneously performed.

In some embodiments, as shown in FIG. 2, the second conductive material 240 includes copper, and the copper of the second seed material 230 is mixed with the copper of the second conductive material 240. In some embodiments, the copper of the second seed material 230 may not be distinguishable from the copper of the second conductive material 240.

In some embodiments, as shown in FIGS. 1 and 2, moving the at least some of the manganese of the second seed material 230 to the location proximate the interface between the second seed material 230 and the second barrier layer 220 includes forming a second manganese-rich layer 2302 including manganese, manganese oxide or a combination thereof at the location.

In some embodiments, as shown in FIG. 2, the second manganese-rich layer 2302 is continuous or discontinuous, and is substantially conformally formed at the location proximate the interface between the second seed material 230 and the second barrier layer 220. In some embodiments, the second manganese-rich layer 2302 is substantially conformally formed on the second barrier layer 220. In some embodiments, at least some of the manganese of the second manganese-rich layer 2302 is in contact with the second barrier layer 220.

In some embodiments, the second manganese-rich layer 2302 has a thickness t4 in a range of from 20 angstroms to 400 angstroms. In some embodiments, a ratio of the thickness t4 of the second manganese-rich layer 2302 to the thickness t3 of the second seed material 230 is in a range of from 1:20 to 1:3, such as from 1:18 to 1:4.

In some embodiments, as shown in FIG. 2, after moving the at least some of the manganese of the second seed material 230 to the location proximate the interface between the second seed material 230 and the second barrier layer 220, the location proximate the interface between the second seed material 230 and the second barrier layer 220 has a greater amount of the manganese than the second conductive material 240 (e.g., an upper surface of the first conductive material 140).

In order to know the effect of manganese on the life time of the semiconductor structure, Experimental Examples 2 and 3 and Comparative Examples 1 and 2 were provided. Specifically, life times of semiconductor structures of Experimental Examples 2 and 3 and Comparative Examples 1 and 2 were measured under a deteriorating condition (i.e., at 200° C. with a current of 126 mA/μm$^2$).

The similarities and differences of the semiconductor structures and process conditions of Experimental Examples 2 and 3 and Comparative Examples 1 and 2 are described below. The semiconductor structure of Experimental Example 2 included the first dielectric material 110, the first barrier layer 120, the first seed material 130 and the first conductive material 140 shown in FIG. 1. The semiconductor structure of Experimental Example 2 was similar to that of Comparative Example 1. The semiconductor structure of Experimental Example 3 included the second dielectric material 210, the second barrier layer 220, the second seed material 230 and the second conductive material 240 shown in FIG. 1. The semiconductor structure of Experimental Example 3 was similar to that of Comparative Example 2. Annealing conditions of Experimental Examples 2 and 3 and Comparative Examples 1 and 2 were the same. The difference was that the semiconductor structures of Experimental Examples 2 and 3 were manufactured using the seed material including copper and manganese (manganese in the seed material is in a range of from 0.10 at % to 0.40 at %), and the semiconductor structures of Comparative Examples 1 and 2 were manufactured using the seed material including copper and excluding manganese.

It is noteworthy that the life times of Experimental Example 2 and Comparative Example 1, which were measured and then converted, were 668.65 years and 129.98 years, respectively. The life times of Experimental Example 3 and Comparative Example 2, which were measured and then converted, were 439.5 years and 87.11 years, respectively. This results means that the seed material including manganese can help increase at least five times the life time of the semiconductor structure.

In another aspect, when the seed material is formed, the seed material may be discontinuously and/or not conformally formed at a location proximate a bottom corner (e.g., a corner of a bell-shaped bottom) of the first barrier layer, causing a void to form in the bottom corner. Therefore, the present disclosure provides a method of manufacturing a semiconductor structure including moving at least some of the manganese of the seed material to the void, and thus can prevent disadvantages resulting from the void. Embodiments of the method of manufacturing the semiconductor structure will be described in detail below.

Figure 6:
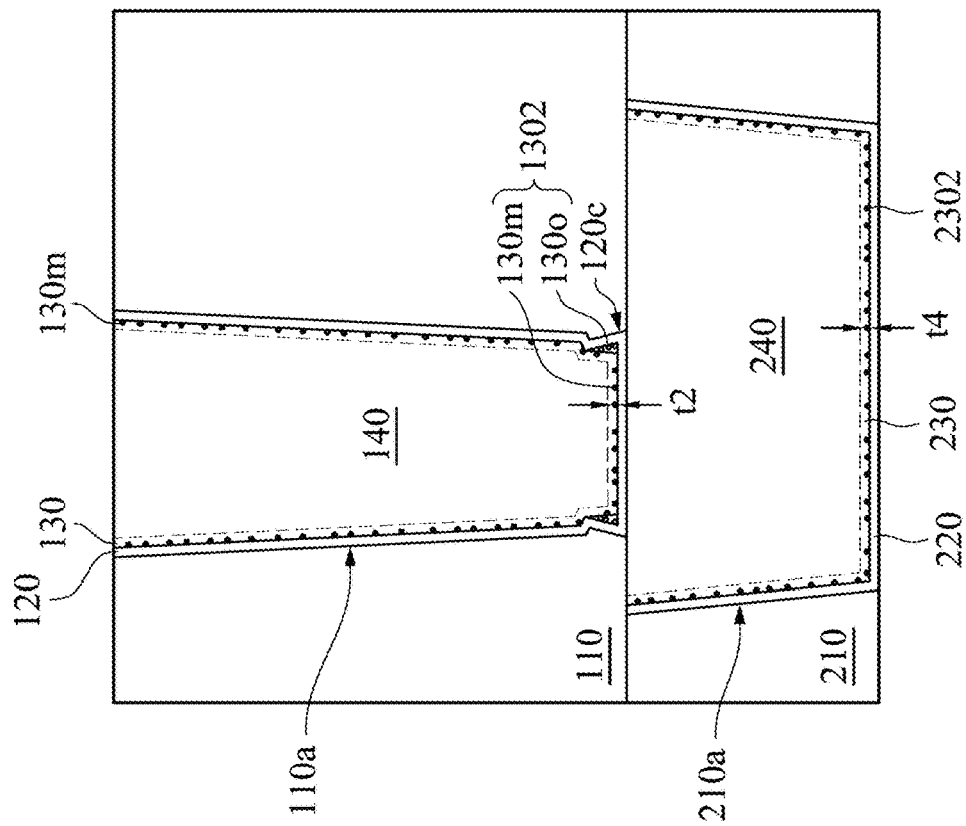
FIGS. 5 and 6 are cross-sectional views of a method of manufacturing a semiconductor structure at various stages in accordance with some embodiments of the present disclosure.
Figure 5:
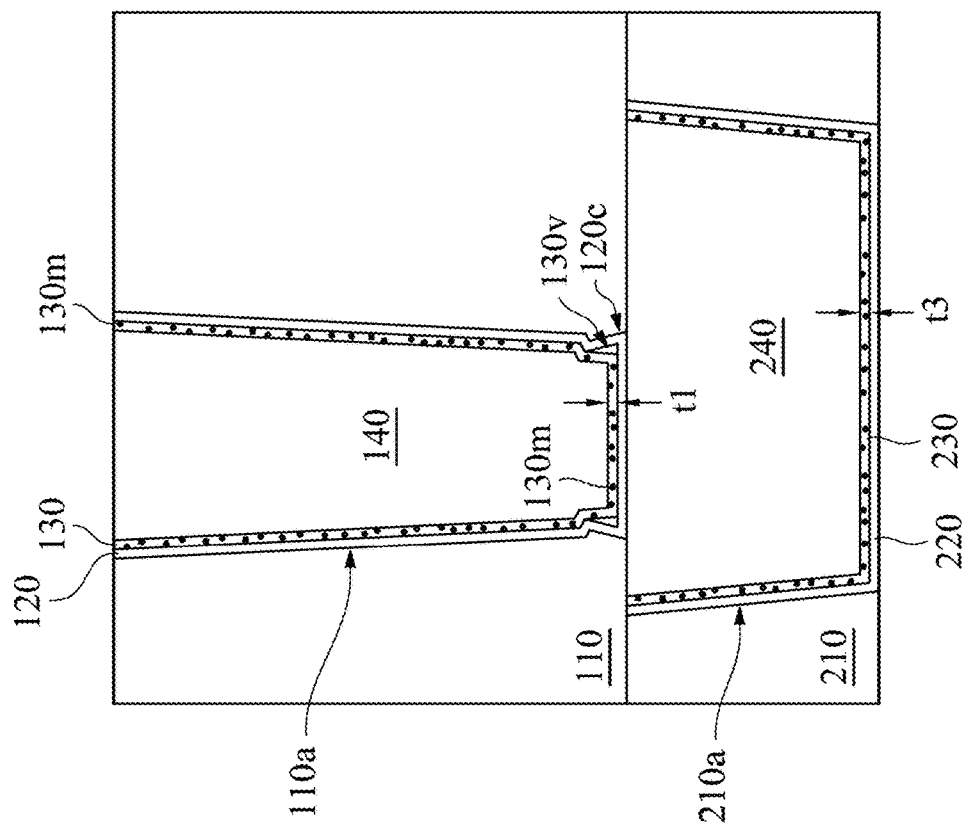

FIGS. 5 and 6 are cross-sectional views of a method of manufacturing a semiconductor structure at various stages in accordance with some embodiments of the present disclosure. The operations of the method of FIG. 5 are similar to those of FIG. 1, and the difference therebetween is that as shown in FIG. 5, when the first seed material 130 is formed on the first barrier layer 120, the first seed material 130 is continuously but not conformally formed near a corner 120c of the first barrier layer 120, causing a void 130v to form at a location proximate the corner 120c of the first barrier layer 120.

However, as shown in FIG. 6, an annealing process is performed on the first seed material 130, and at least some of the manganese of the first seed material is moved to the void 130v. In some embodiments, moving the at least some of the manganese of the first seed material 130 to the void 130v includes forming manganese oxide 130o filling the void 130v, and thus can prevent disadvantages resulting from the void 130v.

Figure 8:
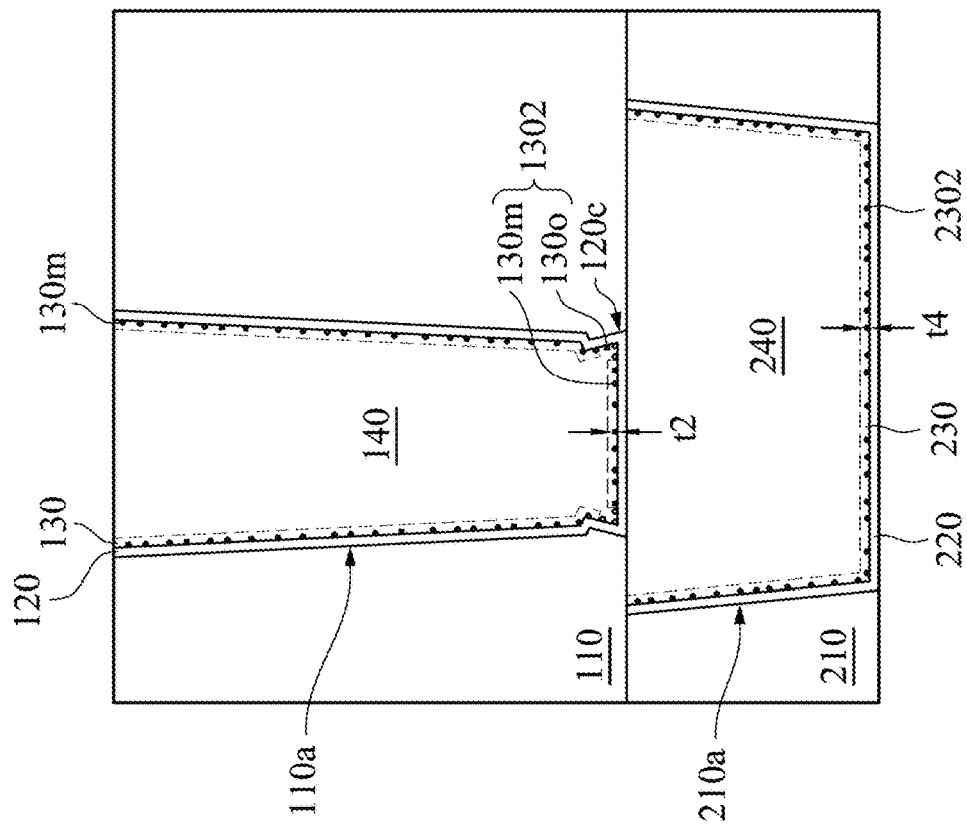
FIGS. 7 and 8 are cross-sectional views of a method of manufacturing a semiconductor structure at various stages in accordance with some embodiments of the present disclosure.
Figure 7:
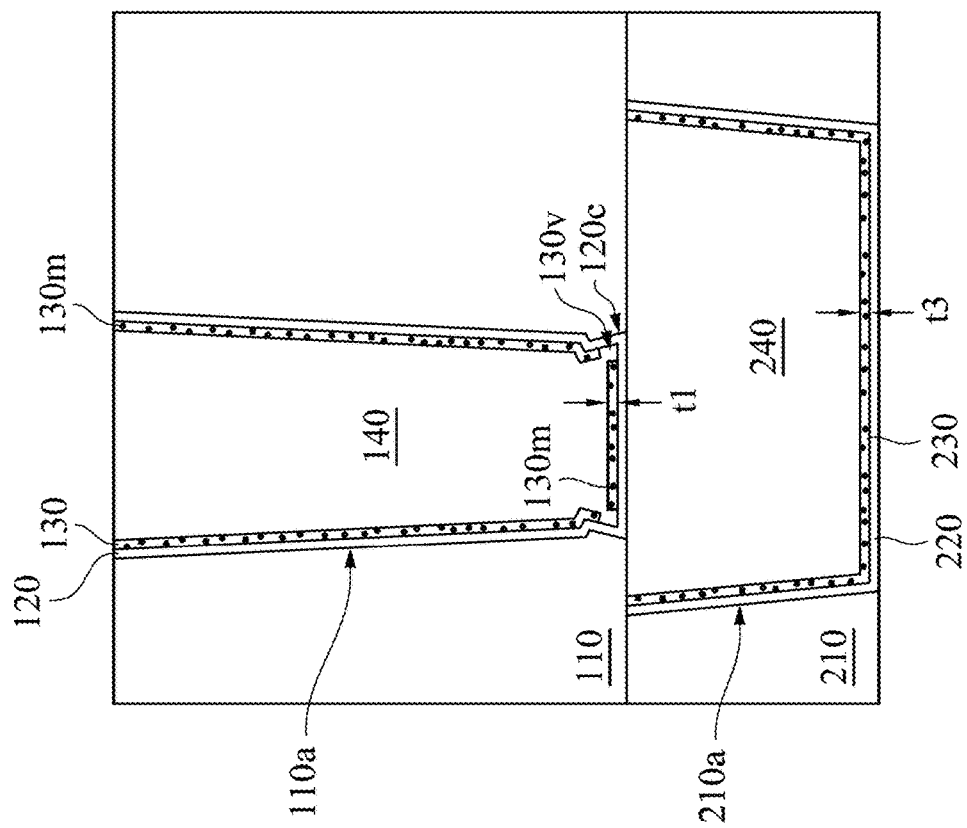

FIGS. 7 and 8 are cross-sectional views of a method of manufacturing a semiconductor structure at various stages in accordance with some embodiments of the present disclosure. The operations of the method of FIG. 7 are similar to those of FIG. 1, and the difference therebetween is that as shown in FIG. 7, when the first seed material 130 is formed on the first barrier layer 120, the first seed material 130 is discontinuously formed near a corner 120c of the first barrier layer 120, causing a void 130v to form at a location proximate the corner 120c of the first barrier layer 120.

However, as shown in FIG. 8, an annealing process is performed on the first seed material 130, and at least some of the manganese of the first seed material is moved to the void 130v. In some embodiments, moving the at least some other of the manganese of the first seed material 130 to the void 130v includes forming manganese oxide 130o filling the void 130v, and thus can prevent disadvantages resulting from the void 130v.

The present disclosure further provides a semiconductor structure. As shown in FIG. 2, 6 or 8, which includes a first conductive material 140, a first barrier layer 120 and a first manganese-rich layer 1302.

The first conductive material 140 includes copper. In some embodiments, the first conductive material 140 is mainly made of copper.

The first barrier layer 120 surrounds the first conductive material 140. In some embodiments, the first barrier layer 120 includes tantalum, titanium, cobalt, tungsten, ruthenium, tantalum nitride, titanium nitride, tungsten nitride, indium oxide or a combination thereof. In some embodiments, the first barrier layer 120 includes tantalum.

The first manganese-rich layer 1302 includes manganese, manganese oxide or a combination thereof. In some embodiments, the first manganese-rich layer 1302 is consisting of manganese, manganese oxide or a combination thereof. The first manganese-rich layer 1302 is in the first conductive material 140 and proximate an interface between the first conductive material 140 and the first barrier layer 120. In some embodiments, the first manganese-rich layer 1302 is continuous or discontinuous, and is substantially conformally disposed at the location proximate the interface between the first conductive material 140 and the first barrier layer 120.

In some embodiments, as shown in FIG. 2, 6 or 8, the first manganese-rich layer 1302 includes the manganese 130m arranged along the interface between the first conductive material 140 and the first barrier layer 120. In some embodiments, the manganese 130m of the first manganese-rich layer 1302 is in contact with the first barrier layer 120.

In some embodiments, as shown in FIG. 6 or 8, the first manganese-rich layer 1302 includes the manganese oxide 130o at a location proximate a corner 120c of the first barrier layer 120. In some embodiments, the manganese oxide 130o of the first manganese-rich layer 1302 is in contact with the corner 120c of the first barrier layer 120.

In some embodiments, as shown in FIG. 2, 6 or 8, the location in the first conductive material 140 and proximate the interface between the first conductive material 140 and the first barrier layer 120 has a greater amount of manganese than other portions of the first conductive material 140 (e.g., an upper surface of the first conductive material 140).

In some embodiments, the first manganese-rich layer 1302 has a thickness t2 in a range of from 20 angstroms to 400 angstroms, such as from 30 angstroms to 350 angstroms, from 40 angstroms to 300 angstroms, from 50 angstroms to 250 angstroms, from 60 angstroms to 200 angstroms, or from 70 angstroms to 150 angstroms.

In some embodiments, as shown in FIG. 2, 6 or 8, the semiconductor structure further includes a second conductive material 240, a second barrier layer 220 and a second manganese-rich layer 2302. Embodiments of the second conductive material 240, the second barrier layer 220 and the second manganese-rich layer 2302 may be the same as or similar to those of the first conductive material 140, the first barrier layer 120 and the first manganese-rich layer 1302, and thus are not repeated here.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A method of manufacturing a semiconductor structure, comprising:
    forming a first opening in a first dielectric material;
    forming a first barrier layer in the first opening;
    forming a first seed material directly on the first barrier layer, wherein the first seed material comprises copper and manganese, and the manganese in the first seed material is in a range of from 0.10 at % to 0.40 at %;
    forming a first conductive material on the first seed material; and
    moving at least some of the manganese of the first seed material to a location proximate an interface defined by the first seed material and the first barrier layer.

2. The method of claim 1, wherein moving the at least some of the manganese of the first seed material to the location proximate the interface between the first seed material and the first barrier layer is conducted by heating the first seed material to a temperature in a range of from 400° C. to 460° C. in a hydrogen atmosphere.

3. The method of claim 1, wherein after moving the at least some of the manganese of the first seed material to the location proximate the interface between the first seed material and the first barrier layer, the location proximate the interface between the first seed material and the first barrier layer has a greater amount of the manganese than the first conductive material.

4. The method of claim 1, wherein moving the at least some of the manganese of the first seed material to the location proximate the interface between the first seed material and the first barrier layer comprises forming a first manganese-rich layer comprising manganese, manganese oxide or a combination thereof at the location.

5. The method of claim 4, wherein a ratio of a thickness of the first manganese-rich layer to a thickness of the first seed material is in a range of from 1:20 to 1:3.

6. The method of claim 1, further comprising:
    forming a void at a location proximate a corner of the first barrier layer when the first seed material comprising the copper and the manganese is formed on the first barrier layer; and
    moving at least some other of the manganese of the first seed material to the void.

7. The method of claim 6, wherein moving the at least some other of the manganese of the first seed material to the void comprises forming manganese oxide filling the void.

8. The method of claim 1, further comprising:
    forming a second dielectric material before forming the first opening in the first dielectric material;
    forming a second opening in the second dielectric material;
    forming a second barrier layer in the second opening;
    forming a second seed material comprising copper and manganese on the second barrier layer;
    forming a second conductive material on the second seed material;
    moving at least some of the manganese of the second seed material to a location proximate an interface between the second seed material and the second barrier layer; and
    forming the first dielectric material on the second dielectric material and the second conductive material.

9. The method of claim 8, wherein the manganese in the second seed material is in a range of from 0.10 at % to 0.40 at %.

10. The method of claim 8, wherein after moving the at least some of the manganese of the second seed material to the location proximate the interface between the second seed material and the second barrier layer, the location proximate the interface between the second seed material and the second barrier layer has a greater amount of the manganese than the second conductive material.

11. The method of claim 8, wherein moving the at least some of the manganese of the second seed material to the location proximate the interface between the second seed material and the second barrier layer comprises forming a second manganese-rich layer comprising manganese, manganese oxide or a combination thereof at the location proximate the interface between the second seed material and the second barrier layer.

12. A method of manufacturing a semiconductor structure, comprising:
    forming a first opening in a first dielectric material;
    forming a first barrier layer in the first opening;
    forming a first seed material directly on the first barrier layer, wherein the first seed material comprises copper and manganese, the manganese in the first seed material is in a range of from 0.10 at % to 0.40 at %, and a void is formed at a location proximate a corner of the first barrier layer when the first seed material comprising the copper and the manganese is formed on the first barrier layer;
    forming a first conductive material on the first seed material; and
    moving at least some of the manganese of the first seed material to the void and a location proximate an interface defined by the first seed material and the first barrier layer.

13. The method of claim 12, wherein moving the at least some of the manganese of the first seed material to the void comprises forming manganese oxide filling the void.

14. A semiconductor structure, comprising:
    a first conductive material comprising copper;
    a first barrier layer surrounding the first conductive material; and
    a first manganese-rich layer in the first conductive material and proximate an interface between the first conductive material and the first barrier layer, wherein the first manganese-rich layer is consisting of manganese, manganese oxide or a combination thereof.

15. The semiconductor structure of claim 14, wherein the first manganese-rich layer comprises the manganese arranged along the interface between the first conductive material and the first barrier layer.

16. The semiconductor structure of claim 15, wherein the manganese is in contact with the first barrier layer.

17. The semiconductor structure of claim 14, wherein the first manganese-rich layer comprises the manganese oxide at a location proximate a corner of the first barrier layer.

18. The semiconductor structure of claim 17, wherein the manganese oxide is in contact with the corner of the first barrier layer.

19. The semiconductor structure of claim 14, wherein a location in the first conductive material and proximate the interface between the first conductive material and the first barrier layer has a greater amount of manganese than an upper surface of the first conductive material.

20. The semiconductor structure of claim 14, wherein a thickness of the first manganese-rich layer is in a range of from 20 angstroms to 400 angstroms.

* * * * *